US012289510B2

(12) United States Patent
Wu et al.

(10) Patent No.: US 12,289,510 B2
(45) Date of Patent: Apr. 29, 2025

(54) OPTICAL ELEMENT DRIVING MECHANISM WITH SUPPORTING ASSEMBLY

(71) Applicant: TDK TAIWAN CORP., Taoyuan (TW)

(72) Inventors: Ya-Hsiu Wu, Taoyuan (TW); Ying-Jen Wang, Taoyuan (TW); Yi-Ho Chen, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 612 days.

(21) Appl. No.: 17/675,557

(22) Filed: Feb. 18, 2022

(65) Prior Publication Data

US 2022/0397755 A1    Dec. 15, 2022

Related U.S. Application Data

(60) Provisional application No. 63/209,750, filed on Jun. 11, 2021.

(51) Int. Cl.
| | |
|---|---|
| *H04N 5/335* | (2011.01) |
| *G01D 5/20* | (2006.01) |
| *G02B 7/02* | (2021.01) |
| *G02B 7/18* | (2021.01) |
| *G03B 13/34* | (2021.01) |
| *H01F 7/08* | (2006.01) |
| *H01F 27/28* | (2006.01) |
| *H02K 41/02* | (2006.01) |
| *H04N 23/54* | (2023.01) |
| *H04N 23/55* | (2023.01) |
| *H04N 23/57* | (2023.01) |
| *H10N 30/20* | (2023.01) |
| *H10N 30/88* | (2023.01) |
| *G02B 7/04* | (2021.01) |

(52) U.S. Cl.
CPC .......... *H04N 23/54* (2023.01); *G01D 5/2046* (2013.01); *G02B 7/022* (2013.01); *G02B 7/023* (2013.01); *G02B 7/1805* (2013.01); *G03B 13/34* (2013.01); *H01F 7/081* (2013.01); *H01F 27/28* (2013.01); *H02K 41/02* (2013.01); *H04N 23/55* (2023.01); *H04N 23/57* (2023.01); *H10N 30/202* (2023.02); *H10N 30/88* (2023.02); *G02B 7/04* (2013.01); *H01F 2007/086* (2013.01)

(58) Field of Classification Search
CPC ..................................... H04N 23/54
See application file for complete search history.

(56) References Cited

U.S. PATENT DOCUMENTS

| | | | |
|---|---|---|---|
| 2006/0070302 A1* | 4/2006 | Seo | H04N 23/54 52/6 |
| 2020/0363626 A1* | 11/2020 | Seo | G03B 30/00 |
| 2022/0150389 A1* | 5/2022 | Smirnov | G03B 3/10 |
| 2022/0283407 A1* | 9/2022 | Wu | G03B 5/00 |

* cited by examiner

*Primary Examiner* — Gary C Vieaux
(74) *Attorney, Agent, or Firm* — MUNCY, GEISSLER, OLDS & LOWE, P.C.

(57) ABSTRACT

An optical element driving mechanism is provided, including a movable part, a fixed part, a driving assembly, and a first supporting assembly. The movable part is used for connecting an optical element. The movable part is movable relative to the fixed part. The driving assembly is used for driving the movable part to move relative to the fixed part. The movable part is movable relative to the fixed part through the support of the first supporting assembly. There is a gap between the movable part and the fixed part.

20 Claims, 10 Drawing Sheets

OPTICAL ELEMENT DRIVING MECHANISM WITH SUPPORTING ASSEMBLY

CROSS REFERENCE TO RELATED APPLICATIONS

This application claims the benefit of U.S. Provisional Application No. 63/209,750, filed 11 Jun. 2021, the entirety of which is incorporated by reference herein.

BACKGROUND OF THE INVENTION

Field of the Invention

The present disclosure relates to an optical element driving mechanism, and more particularly to the optical element driving mechanism of an electrical device.

Description of the Related Art

As the relevant technologies have been developed, many electronic devices (such as computers and tablets) have been equipped with the capability to record images and videos. However, when an optical element (such as a lens) having a long focal length is provided in an electronic device, the thickness of the electronic device may be increased, impeding the prospects for miniaturization of the electronic device. Therefore, how to design an optical element driving mechanism and an optical device that help to miniaturize the electronic device has become an important issue.

BRIEF SUMMARY OF THE INVENTION

To solve the problems of the prior art, an optical element driving mechanism is provided, including a movable part, a fixed part, a driving assembly, and a first supporting assembly. The movable part is used for connecting an optical element. The movable part is movable relative to the fixed part. The driving assembly is used to drive the movable part to move relative to the fixed part. The movable part is movable relative to the fixed part through the support of the first supporting assembly. There is a gap between the movable part and the fixed part.

In one of the embodiments of the present disclosure, the first supporting assembly includes a first supporting element, having an elongated structure and extending along a first axis; and a positioning element, for positioning the first supporting element. The driving assembly is used for driving the movable part to move in a first dimension. The first dimension is a rotation around a first rotation axis, and the first rotation axis is parallel to the first axis. The positioning element has a plate-like structure. The positioning element is made of metal. The positioning element includes a low magnetic-permeability material. The positioning element is in direct contact with the first supporting element.

In one of the embodiments of the present disclosure, the positioning element includes: a positioning element first movable part frame fixing end, fixedly connected to a movable part frame first surface of the movable part frame of the movable part; a positioning element positioning portion, corresponding to the first supporting element; a positioning element second movable part frame fixing end, fixedly connected to the movable part frame second surface of the movable part frame; a positioning element first elastic portion, being flexible, wherein the positioning element positioning portion is movably connected to the positioning element first movable part frame fixing end through the positioning element first elastic portion; and a positioning element second elastic portion, being flexible, wherein the positioning element positioning portion is movably connected to the positioning element second movable part frame fixing end through the positioning element second elastic portion. The positioning element positioning portion is in direct contact with the first supporting element. There is a gap between the movable part frame first surface and the movable part frame second surface. The movable part frame first surface is perpendicular to a second axis. The movable part frame first surface is parallel to the first axis. The movable part frame first surface at least partially overlaps the positioning element when viewed along the second axis. The first supporting element at least partially overlaps the movable part frame third surface of the movable part frame when viewed along the second axis. The first supporting element is movable relative to the fixed part. The first supporting element is movable relative to the movable part. The first supporting element is disposed in a movable part frame recess of the movable part frame.

In one of the embodiments of the present disclosure, the movable part frame recess includes a movable part frame recess first surface and a movable part frame recess second surface. The first supporting element is disposed between the movable part frame recess first surface and the movable part frame recess second surface. In a third axis, the shortest distance between the movable part frame recess first surface and the movable part frame recess second surface is 0.03 mm to 0.1 mm greater than the maximum dimension of the first supporting element. The third axis is perpendicular to the second axis. The third axis is perpendicular to the first axis. In the second axis, the shortest distance between the positioning element and the movable part frame third surface is 0.03 mm to 0.1 mm greater than the maximum dimension of the first supporting element.

In one of the embodiments of the present disclosure, the driving assembly includes: a first driving magnetic element; a second driving magnetic element; a first driving coil, corresponding to the first driving magnetic element; and a second driving coil, corresponding to the second driving magnetic element. The first driving magnetic element having an elongated structure extends along the first axis when viewed along the second axis. The second driving magnetic element having an elongated structure extends along the first axis when viewed along the second axis. The first driving magnetic element is fixedly disposed on the movable part frame. The second driving magnetic element is fixedly disposed on the movable part frame.

In one of the embodiments of the present disclosure, the first driving coil is fixedly disposed on the fixed part. The second driving coil is fixedly disposed on the fixed part. The first driving coil does not overlap the second driving magnetic element when viewed along the third axis. The first driving coil does not overlap the second driving magnetic element when viewed along the first axis. The first driving coil does not overlap the second driving coil when viewed along the third axis. The first driving coil does not overlap the second driving coil when viewed along the first axis.

In one of the embodiments of the present disclosure, the optical element driving mechanism has an elongated structure when viewed along the second axis. The optical element driving mechanism extends along the first axis when viewed along the second axis. The first driving magnetic element does not overlap the positioning element when viewed along the second axis. The first driving coil does not overlap the positioning element when viewed along the second axis. The second driving magnetic element does not overlap the positioning element when viewed along the second axis. The second driving coil does not overlap the positioning element when viewed along the second axis.

In one of the embodiments of the present disclosure, the driving assembly does not overlap the positioning element when viewed along the second axis. The driving assembly partially overlaps the positioning element when viewed along the first axis. The first driving magnetic element partially overlaps the positioning element when viewed along the first axis. The first driving magnetic element partially overlaps the positioning element first elastic portion when viewed along the first axis.

In one of the embodiments of the present disclosure, the first driving coil does not overlap the positioning element when viewed along the first axis. The first driving magnetic element does not overlap the positioning element second elastic portion when viewed along the first axis. The first driving coil does not overlap the positioning element second elastic portion when viewed along the first axis. The second driving magnetic element partially overlaps the positioning element when viewed along the first axis.

In one of the embodiments of the present disclosure, the second driving magnetic element does not overlap the positioning element first elastic portion when viewed along the first axis. The second driving coil does not overlap the positioning element, when viewed along the first axis. The second driving magnetic element partially overlaps the positioning element second elastic portion when viewed along the first axis. The second driving coil does not overlap the positioning element second elastic portion when viewed along the first axis.

In one of the embodiments of the present disclosure, the driving assembly partially overlaps the positioning element when viewed along the third axis. The first driving magnetic element does not overlap the positioning element first elastic portion when viewed along the third axis. The first driving magnetic element partially overlaps the positioning element second elastic portion when viewed along the third axis. The first driving coil does not overlap the positioning element first elastic portion when viewed along the third axis. The first driving coil partially overlaps the positioning element second elastic portion when viewed along the third axis. The second driving magnetic element partially overlaps the positioning element first elastic portion when viewed along the third axis. The second driving magnetic element does not overlap the positioning element second elastic portion when viewed along the third axis. The second driving coil partially overlaps the positioning element first elastic portion when viewed along the third axis. The second driving coil does not overlap the positioning element second elastic portion when viewed along the third axis.

In one of the embodiments of the present disclosure, the optical element driving mechanism further including a second supporting assembly, wherein the optical element is movable relative to the movable part frame through the second supporting assembly. The second supporting assembly includes: a second supporting assembly first movable part frame fixing end, fixedly connected to a movable part frame fourth surface of the movable part frame; a second supporting assembly setting portion, for setting the optical element; a second supporting assembly second movable part frame fixing end, fixedly connected to the movable part frame fifth surface of the movable part frame; a second supporting assembly first elastic portion, being flexible, wherein the second supporting assembly setting portion is movably connected to the second supporting assembly first movable part frame fixing end through the second supporting assembly first elastic portion; and a second supporting assembly second elastic portion, being flexible, wherein the second supporting assembly setting portion is movably connected to the second supporting assembly second movable part frame fixing end through the second supporting assembly second elastic portion. The movable part frame fourth surface is located at a movable part frame first recessed portion of the movable part frame, and the movable part frame first recessed portion has a recessed structure. The movable part frame fifth surface is located at a movable part frame second recessed portion of the movable part frame, and the movable part frame second recessed portion has a recessed structure. The second supporting assembly first movable part frame fixing end and the second supporting assembly second movable part frame fixing end are arranged along the third axis when viewed along the second axis. The positioning element first movable part frame fixing end and the positioning element second movable part frame fixing end are arranged along the third axis when viewed along the second axis.

In one of the embodiments of the present disclosure, the second supporting assembly does not have a mirror symmetry structure when viewed along the second axis. The positioning element does not overlap the second supporting assembly when viewed along the first axis. The positioning element is located between the first supporting element and the second supporting assembly when viewed along the first axis. The second supporting assembly does not overlap the first supporting element when viewed along the first axis. The positioning element partially overlaps the second supporting assembly when viewed along the second axis.

In one of the embodiments of the present disclosure, the positioning element first elastic portion partially overlaps the second supporting assembly first elastic portion when viewed along the second axis. The positioning element second elastic portion partially overlaps the second supporting assembly second elastic portion when viewed along the second axis. The second supporting assembly setting portion overlaps the first supporting element when viewed along the second axis. The second supporting assembly setting portion overlaps the positioning element positioning portion when viewed along the second axis.

In one of the embodiments of the present disclosure, the positioning element includes: wherein the second supporting assembly partially overlaps the driving assembly when viewed along the first axis. The second supporting assembly does not overlap the first driving magnetic element when viewed along the first axis. The second supporting assembly does not overlap the first driving magnetic element when viewed along any direction that is perpendicular to the second axis. The second supporting assembly partially overlaps the first driving coil when viewed along the first axis.

In one of the embodiments of the present disclosure, the second supporting assembly setting portion has an elongated structure when viewed along the second axis. The second supporting assembly setting portion extends along the first axis or the third axis when viewed along the second axis. The second supporting assembly includes a metal material. The second supporting assembly includes a low magnetic-permeability material.

In one of the embodiments of the present disclosure, the optical element is a reflective structure. The second supporting assembly setting portion has a second supporting assembly setting portion surface corresponding to the optical element. The reflective structure is used to reflect an electromagnetic wave. The optical element and the second supporting assembly setting portion have an integrated structure.

In one of the embodiments of the present disclosure, the positioning element includes: wherein the reflection structure is directly formed on the second supporting assembly setting portion surface. The roughness of the second supporting assembly setting portion surface is different from the surface roughness of the second supporting assembly first elastic portion. The roughness of the second supporting assembly setting portion surface is different from the surface roughness of the second supporting assembly first movable part frame fixing end. The roughness of the second supporting assembly setting portion surface is lower than the surface roughness of the second supporting assembly first elastic portion. The roughness of the second supporting assembly setting portion surface is lower than the surface roughness of the second supporting assembly first movable part frame fixing end.

In one of the embodiments of the present disclosure, the second supporting assembly setting portion has a first resonance frequency relative to the movable part frame. The movable part frame has a second resonance frequency relative to the fixed part. The first resonant frequency is different from the second resonant frequency. The positioning element positioning portion is fixedly connected to the first supporting element. The positioning element has a plate-like structure. The second supporting assembly has a plate-like structure. The positioning element is parallel to the second supporting assembly.

In one of the embodiments of the present disclosure, the driving assembly is used to drive the optical element to move relative to the movable part frame in a second dimension. The second dimension is different from the first dimension. The second dimension is a rotation about a second rotation axis, and the second rotation axis is not parallel to the first rotation axis. The second rotation axis does not overlap the first rotation axis, and there is a gap between the second rotation axis and the first rotation axis. The second rotation axis does not overlap the first rotation axis when viewed along the first axis. The second rotation axis is parallel to the third axis.

BRIEF DESCRIPTION OF THE DRAWINGS

The present invention may be more fully understood by reading the subsequent detailed description and examples with references made to the accompanying drawings, wherein.

DETAILED DESCRIPTION OF THE INVENTION

The making and using of optical element driving mechanisms of embodiments of the present disclosure are discussed in detail below. It should be appreciated, however, that the embodiments provide many applicable inventive concepts that may be embodied in a wide variety of specific contexts. The specific embodiments discussed are merely illustrative of specific ways to make and use the embodiments and do not limit the scope of the disclosure.

It should be understood that, although the terms "first", "second" etc. may be used herein to describe various elements, layers and/or portions, and these elements, layers, and/or portions should not be limited by these terms. These terms are only used to distinguish one element, layer, or portion. Thus, a first element, layer or portion discussed below could be termed a second element, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

The scale of the drawings in the present disclosure may be drawn according to the actual size. The scale of the same figure in the present disclosure can be used as the actual manufacturing scale of the devices, equipment, elements, etc. of the present disclosure. It should be noted that each figure may be drawn at different orientations, which may result in different size ratios among different figures. However, the size ratio shown in an individual figure is not affect by the different size ratios between different figures. People with ordinary skill in the art can understand that the size ratio of the figures in the present disclosure can be used as a distinguishing feature from the prior art.

Figure 1:
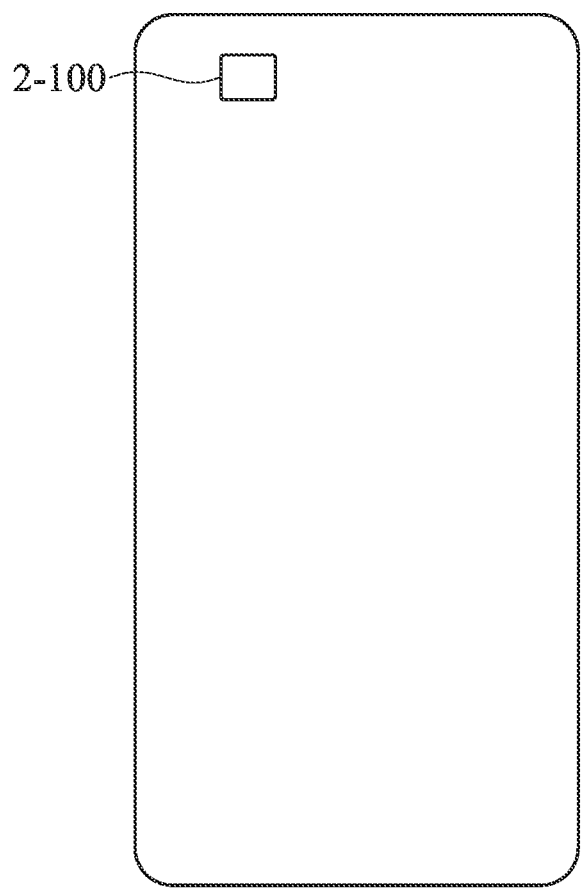
FIG. 1 is a schematic view of an electrical device according to some embodiment of the present disclosure.

Firstly, please refer to FIG. 1, FIG. 1 is a schematic view of an electrical device 2-1 according to some embodiment of the present disclosure. As shown in FIG. 1, an optical element driving mechanism 2-100 of some embodiment of the present disclosure may be mounted in an electrical device 2-1 for taking photos or videos, wherein the aforementioned electrical device 2-1 may, for example, be a smartphone or a digital camera, but the present disclosure is not limited to these. It should be noted that the position and the size between the optical element driving mechanism 2-100 and the electrical device 2-1 shown in FIG. 1 are only an example, which is not for limiting the position and the size between the optical element driving mechanism 2-100 and the electrical device 2-1. In fact, according to different needs, the optical element driving mechanism 2-100 may be mounted at different positions in the electrical device 2-1

Figure 2:
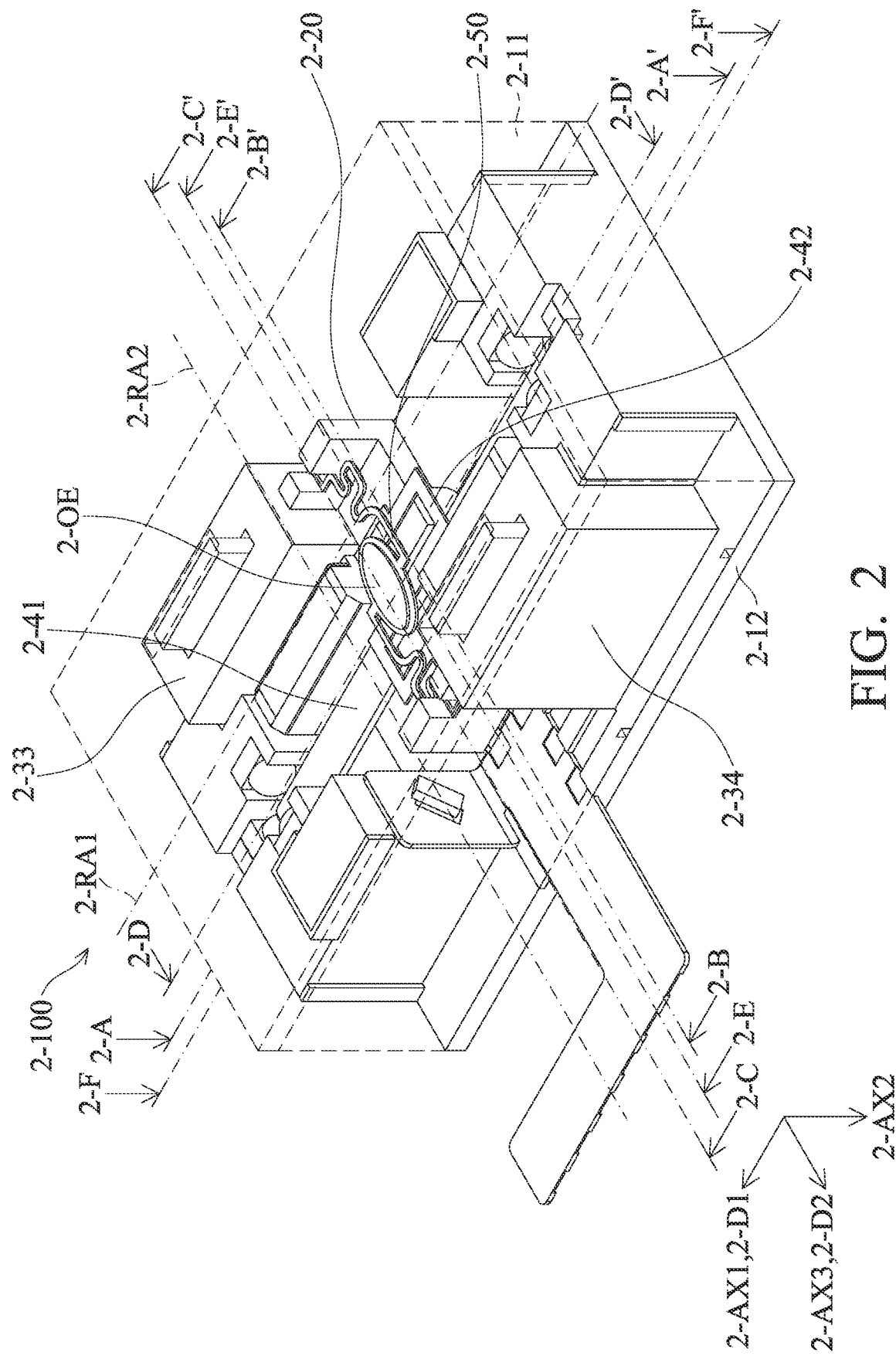
FIG. 2 is a schematic view of an optical element driving mechanism and an optical element according to some embodiments of the present disclosure, wherein an outer frame is shown as a dashed line.
Figure 3:
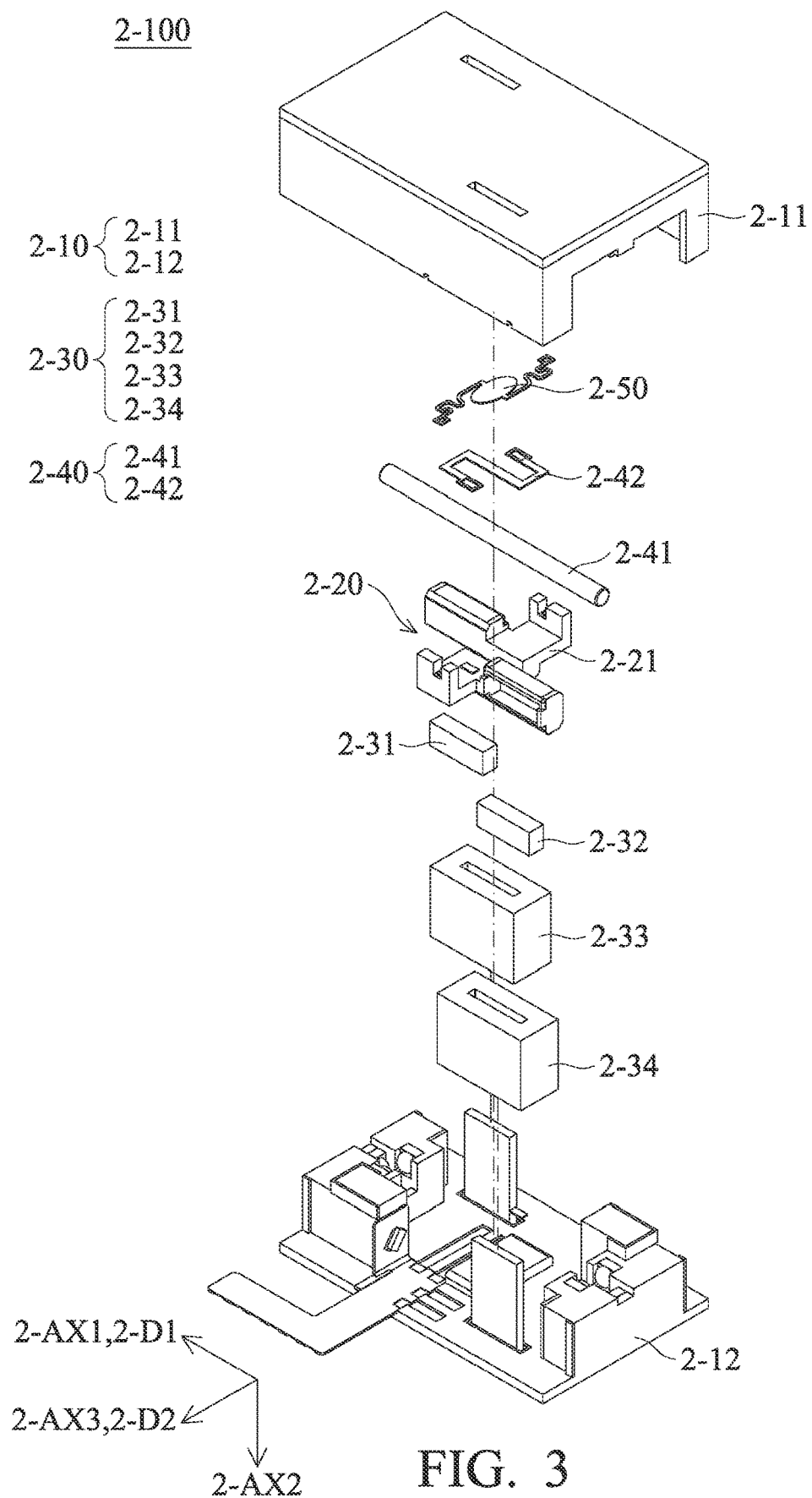
FIG. 3 is an exploded view of the optical element driving mechanism according to some embodiments of the present disclosure.

Please refer to FIG. 2. FIG. 2 is a schematic view of the optical element driving mechanism 2-100 and an optical element 2-OE according to some embodiments of the present disclosure, wherein the outer frame is shown as a dashed line. FIG. 3 is an exploded view of the optical element driving mechanism 2-100 according to some embodiments of the present disclosure.

As shown in FIG. 2 and FIG. 3, the optical element driving mechanism 2-100 may include a fixed part 2-10, a movable part 2-20, a driving assembly 2-30, a first supporting assembly 2-40, and a second supporting assembly 2-50.

According to some embodiments of the present disclosure, there may be a gap between the movable part 2-20 and the fixed part 2-10, so that the movable part 2-20 may move relative to the fixed part 2-10. The driving assembly 2-30 may drive the movable part 2-20 to move relative to the fixed part 2-10.

According to some embodiments of the present disclosure, the driving assembly 2-30 may be used to drive the movable part 2-20 to move in a first dimension 2-D1. According to some embodiments of the present disclosure, the first dimension 2-D1 may be the rotation about a first rotation axis 2-RA1, and the first rotation axis 2-RA1 may be parallel to a first axis 2-AX1.

According to some embodiments of the present disclosure, the movable part 2-20 may be connected to the optical element 2-OE, and the movable part 2-20 may be moved relative to the fixed part 2-10 through the support of the first supporting assembly 2-40.

According to some embodiments of the present disclosure, the first supporting assembly 2-40 may be at least partially located between the movable part 2-20 and the fixed part 2-10. According to some embodiments of the present disclosure, the optical element 2-OE may move relative to the movable part 2-20 through the second supporting assembly 2-50.

The fixed part 2-10 may include an outer frame 2-11 and a base 2-12. The outer frame 2-11 may be disposed on the base 2-12 to form an inner space and accommodate the elements of the optical element driving mechanism 2-100.

The movable part 2-20 may include a movable part frame 2-21. The driving assembly 2-30 may include a first driving magnetic element 2-31, a second driving magnetic element 2-32, a first driving coil 2-33, and a second driving coil 2-34. The first supporting assembly 2-40 may include a first supporting element 2-41 and a positioning element 2-42.

According to some embodiments of the present disclosure, the first supporting element 2-41 may move relative to the fixed part 2-10. According to some embodiments of the present disclosure, the first supporting element 2-41 may move the movable part 2-20.

Figure 4:
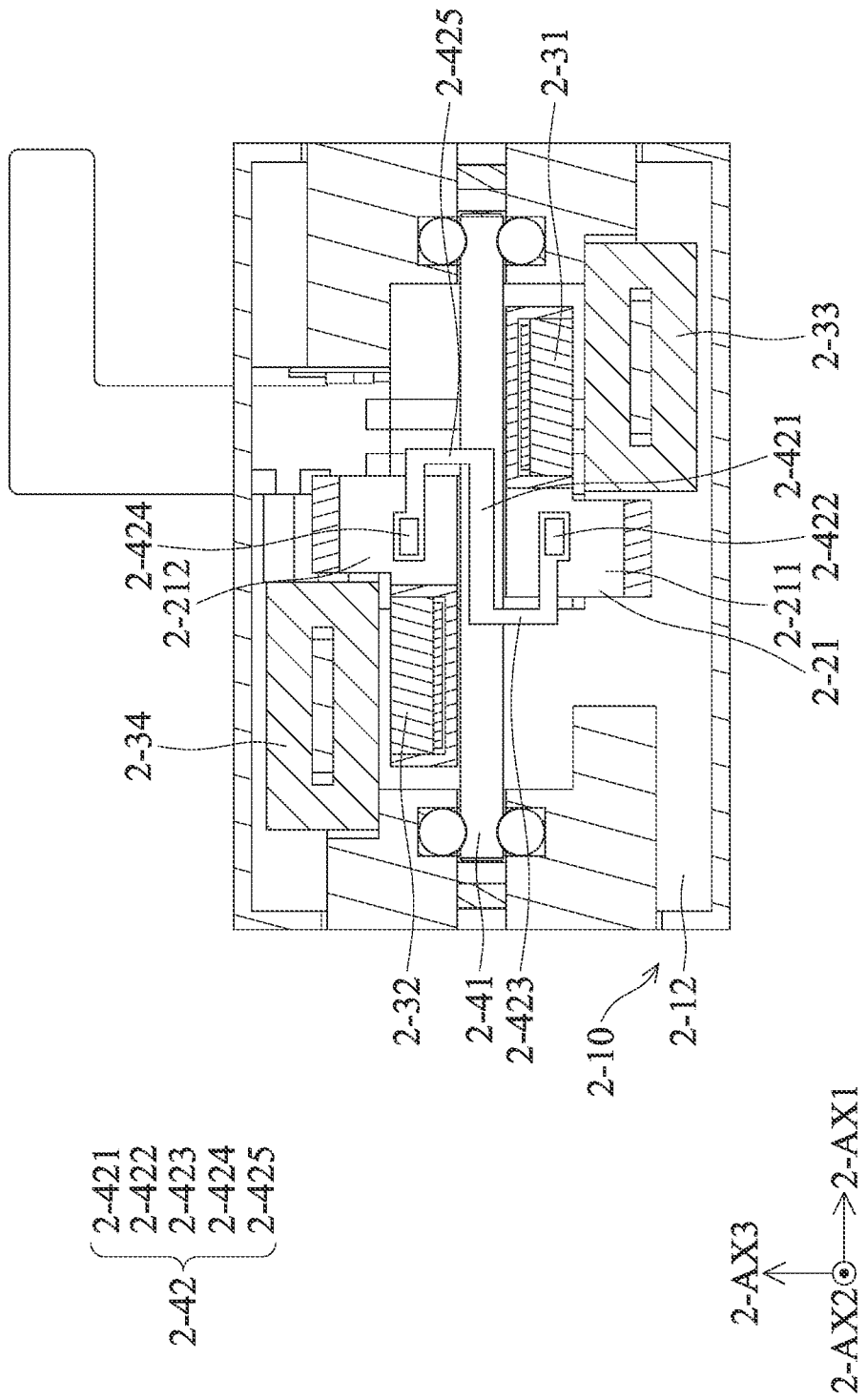
FIG. 4 is a cross-sectional view of the optical element driving mechanism along line 2-A-2-A' of FIG. 2, according to some embodiments of the present disclosure.

Please refer to FIG. 4, FIG. 4 is a cross-sectional view of the optical element driving mechanism 2-100 along line 2-A-2-A' of FIG. 2, according to some embodiments of the present disclosure.

As shown in FIG. 4, the first driving coil 2-33 may correspond to the first driving magnetic element 2-31. The second driving coil 2-34 may correspond to the second driving magnetic element 2-32.

According to some embodiments of the present disclosure, the optical element driving mechanism 2-100 may have an elongated structure when viewed along a second axis 2-AX2 that is perpendicular to the first axis 2-AX1. According to some embodiments of the present disclosure, the optical element driving mechanism 2-100 may extend along the first axis 2-AX1 when viewed along the second axis 2-AX2.

Please refer to FIG. 4, according to some embodiments of the present disclosure, the first driving magnetic element 2-31 may have an elongated structure when viewed along the second axis 2-AX2. According to some embodiments of the present disclosure, the second driving magnetic element 2-32 may have an elongated structure when viewed along the second axis 2-AX2.

According to some embodiments of the present disclosure, the first driving magnetic element 2-31 may extend along the first axis 2-AX1 when viewed along the second axis 2-AX2. According to some embodiments of the present disclosure, the second driving magnetic element 2-32 may extend along the first axis 2-AX1 when viewed along the second axis 2-AX2.

According to some embodiments of the present disclosure, the first driving magnetic element 2-31 may be fixedly disposed on the movable part frame 2-21. According to some embodiments of the present disclosure, the second driving magnetic element 2-32 may be fixedly disposed on the movable part frame 2-21.

As shown in FIG. 4, according to some embodiments of the present disclosure, the first driving coil 2-33 may be fixedly disposed on the fixed part 2-10. According to some embodiments of the present disclosure, the second driving coil 2-34 may be fixedly disposed on the fixed part 2-10.

According to some embodiments of the present disclosure, the first driving coil 2-33 may be fixedly disposed on the base 2-12 of the fixed part 2-10. According to some embodiments of the present disclosure, the second driving coil 2-34 may be fixedly disposed on the base 2-12 of the fixed part 2-10.

Please refer to FIG. 4, according to some embodiments of the present disclosure, the first driving coil 2-33 may not overlap the second driving coil 2-34 when viewed along the first axis 2-AX1. According to some embodiments of the present disclosure, the first driving coil 2-33 may not overlap the first driving magnetic element 2-31 when viewed along the first axis 2-AX1. According to some embodiments of the present disclosure, the first driving coil 2-33 may not overlap the second driving magnetic element 2-32 when viewed along the first axis 2-AX1.

According to some embodiments of the present disclosure, the first driving coil 2-33 may not overlap the second driving coil 2-34 when viewed along a third axis 2-AX3. According to some embodiments of the present disclosure, the first driving coil 2-33 may not overlap the second driving magnetic element 2-32 when viewed along the third axis 2-AX3. It should be noted that, according to some embodiments of the present disclosure, the third axis 2-AX3 may be perpendicular to the first axis 2-AX1 and the second axis 2-AX2.

According to some embodiments of the present disclosure, the second driving coil 2-34 may not overlap the first driving magnetic element 2-31 when viewed along the first axis 2-AX1. According to some embodiments of the present disclosure, the second driving coil 2-34 may not overlap the second driving magnetic element 2-32 when viewed along the first axis 2-AX1. According to some embodiments of the present disclosure, the second driving coil 2-34 may not overlap the first driving magnetic element 2-31 when viewed along the third axis 2-AX3.

As shown in FIG. 4, according to some embodiments of the present disclosure, the first driving coil 2-33 may not overlap the first supporting element 2-41 when viewed along the first axis 2-AX1. According to some embodiments of the present disclosure, the second driving coil 2-34 may not overlap the first supporting element 2-41 when viewed along the first axis 2-AX1.

According to some embodiments of the present disclosure, the first driving magnetic element 2-31 may not overlap the first supporting element 2-41 when viewed along the first axis 2-AX1. According to some embodiments of the present disclosure, the second driving magnetic element 2-32 may not overlap the first supporting element 2-41 when viewed along the first axis 2-AX1.

Please refer to FIG. 4, according to some embodiments of the present disclosure, the first driving coil 2-33 may overlap the first driving magnetic element 2-31 when viewed along the third axis 2-AX3. According to some embodiments of the present disclosure, the second driving coil 2-34 may overlap the second driving magnetic element 2-32 when viewed along the third axis 2-AX3.

According to some embodiments of the present disclosure, the first driving coil 2-33 may overlap the first supporting element 2-41 when viewed along the third axis 2-AX3. According to some embodiments of the present disclosure, the second driving coil 2-34 may overlap the first supporting element 2-41 when viewed along the third axis 2-AX3.

According to some embodiments of the present disclosure, the first driving magnetic element 2-31 may overlap the first supporting element 2-41 when viewed along the third axis 2-AX3. According to some embodiments of the present disclosure, the second driving magnetic element 2-32 may overlap the first supporting element 2-41 when viewed along the third axis 2-AX3.

As shown in FIG. 4, the first supporting element 2-41 may have an elongated structure, and the first supporting element 2-41 may extend along the first axis 2-AX1. The positioning element 2-42 may be used to position the first supporting element 2-41. According to some embodiments of the present disclosure, the positioning element 2-42 may be in direct contact with the first supporting element 2-41.

According to some embodiments of the present disclosure, the positioning element 2-42 may have a plate-like structure. According to some embodiments of the present disclosure, the positioning element 2-42 may be made of metal material. According to some embodiments of the present disclosure, the positioning element 2-42 may include materials with low magnetic-permeability.

Please refer to FIG. 4, the positioning element 2-42 may include a positioning element positioning portion 2-421, a positioning element first movable part frame fixing end 2-422, a positioning element first elastic portion 2-423, a positioning element second movable part frame fixing end 2-424, and a positioning element second elastic portion 2-425.

According to some embodiments of the present disclosure, the positioning element positioning portion 2-421 may correspond to the first supporting element 2-41. According to some embodiments of the present disclosure, the positioning element first movable part frame fixing end 2-422 may be fixedly connected to a movable part frame first surface 2-211 of the movable part frame 2-21 of the movable part 2-20.

According to some embodiments of the present disclosure, the positioning element first elastic portion 2-423 may be flexible. According to some embodiments of the present disclosure, the positioning element second movable part frame fixing end 2-424 may be fixedly connected to a movable part frame second surface 2-212 of the movable part frame 2-21. According to some embodiments of the present disclosure, the positioning element second elastic portion 2-425 may be flexible.

According to some embodiments of the present disclosure, the positioning element positioning portion 2-421 may be movably connected to the positioning element first movable part frame fixing end 2-422 through the positioning element first elastic portion 2-423. According to some embodiments of the present disclosure, the positioning element positioning portion 2-421 may be connected to the positioning element second movable part frame fixing end 2-424 through the positioning element second elastic portion 2-425.

According to some embodiments of the present disclosure, the positioning element positioning portion 2-421 may be in direct contact with the first supporting element 2-41.

As shown in FIG. 4, according to some embodiments of the present disclosure, there may be a gap between the movable part frame first surface 2-211 and the movable part frame second surface 2-212. According to some embodiments of the present disclosure, the first supporting element 2-41 may be disposed in the gap between the movable part frame first surface 2-211 and the movable part frame second surface 2-212.

According to some embodiments of the present disclosure, the movable part frame first surface 2-211 may be perpendicular to the second axis 2-AX2. According to some embodiments of the present disclosure, the movable part frame first surface 2-211 may be parallel to the first axis 2-AX1. According to some embodiments of the present disclosure, the movable part frame first surface 2-211 may be parallel to the third axis 2-AX3.

According to some embodiments of the present disclosure, the movable part frame second surface 2-212 may be perpendicular to the second axis 2-AX2. According to some embodiments of the present disclosure, the movable part frame second surface 2-212 may be parallel to the first axis 2-AX1. According to some embodiments of the present disclosure, the movable part frame second surface 2-212 may be parallel to the third axis 2-AX3.

According to some embodiments of the present disclosure, the movable part frame first surface 2-211 may at least partially overlap the positioning element 2-42 when viewed along the second axis 2-AX2. According to some embodiments of the present disclosure, the movable part frame second surface 2-212 may at least partially overlap the positioning element 2-42 when viewed along the second axis 2-AX2.

According to some embodiments of the present disclosure, the movable part frame first surface 2-211 may at least partially overlap the first supporting element 2-41 when viewed along the third axis 2-AX3. According to some embodiments of the present disclosure, the movable part frame second surface 2-212 may at least partially overlap the first supporting element 2-41 when viewed along the third axis 2-AX3.

In this way, the internal space of the optical element driving mechanism 2-100 may be effectively utilized, and the effect of miniaturizing the optical element driving mechanism 2-100 may be achieved.

According to some embodiments of the present disclosure, the movable part frame first surface 2-211 may not overlap the first supporting element 2-41 when viewed along the second axis 2-AX2. According to some embodiments of the present disclosure, the movable part frame second surface 2-212 may not overlap the first supporting element 2-41 when viewed along the second axis 2-AX2.

In this way, the undesired movement of the first supporting element 2-41 may be avoided; thereby the optical element driving mechanism 2-100 is more stable.

As shown in FIG. 4, according to some embodiments of the present disclosure, the first driving magnetic element 2-31 may not overlap the positioning element 2-42 when viewed along the second axis 2-AX2.

According to some embodiments of the present disclosure, the first driving coil 2-33 may not overlap the positioning element 2-42 when viewed along the second axis 2-AX2.

According to some embodiments of the present disclosure, the second driving magnetic element 2-32 may not overlap the positioning element 2-42 when viewed along the second axis 2-AX2.

According to some embodiments of the present disclosure, the second driving coil 2-34 may not overlap the positioning element 2-42 when viewed along the second axis 2-AX2.

That is, according to some embodiments of the present disclosure, the driving assembly 2-30 may not overlap the positioning element 2-42 when viewed along the second axis 2-AX2.

In this way, magnetic interference may be effectively avoided, thereby increasing the manipulation accuracy of the optical element driving mechanism 2-100.

Figure 5:
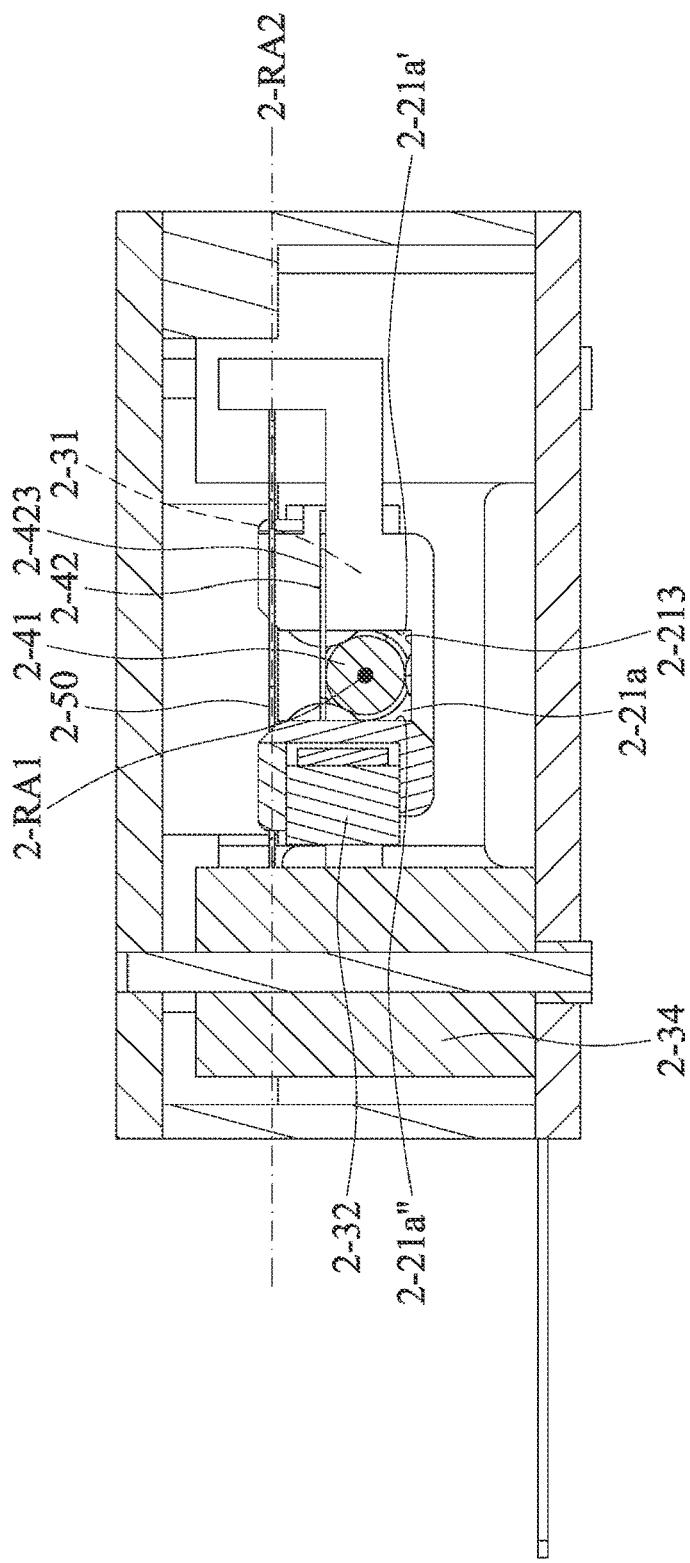
FIG. 5 is a cross-sectional view of the optical element driving mechanism along line 2-B-2-B' of FIG. 2, according to some embodiments of the present disclosure.
Figure 6:
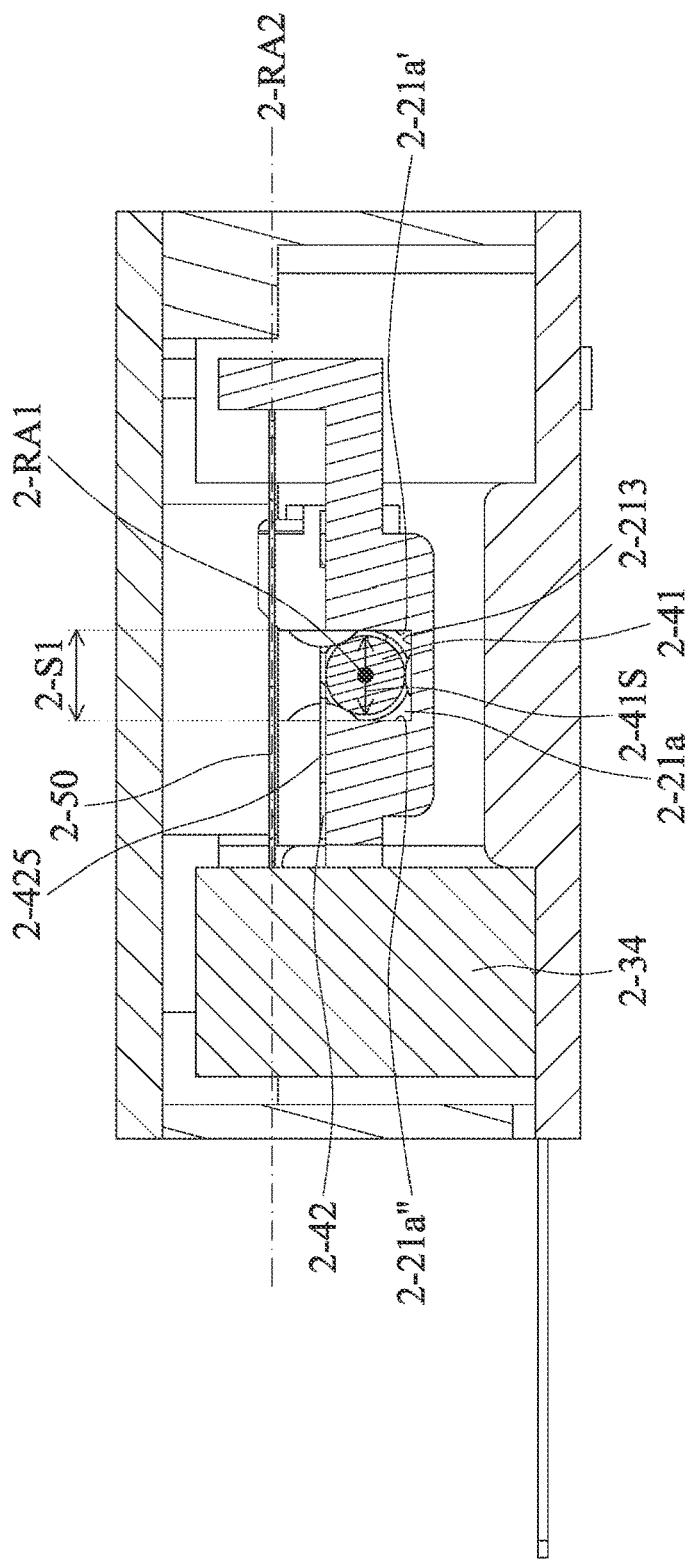
FIG. 6 is a cross-sectional view of the optical element driving mechanism along line 2-C-2-C' of FIG. 2, according to some embodiments of the present disclosure.

Please refer to FIG. 5 and FIG. 6, FIG. 5 is a cross-sectional view of the optical element driving mechanism 2-100 along line 2-B-2-B' of FIG. 2, according to some embodiments of the present disclosure; FIG. 6 is a cross-sectional view of the optical element driving mechanism 2-100 along line 2-C-2-C' of FIG. 2, according to some embodiments of the present disclosure.

According to some embodiments of the present disclosure, the driving assembly 2-30 may partially overlap the positioning element 2-42 when viewed along the first axis 2-AX1.

According to some embodiments of the present disclosure, the first driving magnetic element 2-31 may partially overlap the positioning element 2-42 when viewed along the first axis 2-AX1.

According to some embodiments of the present disclosure, the first driving magnetic element 2-31 may partially overlap the positioning element first elastic portion 2-423 when viewed along the first axis 2-AX1.

According to some embodiments of the present disclosure, the second driving magnetic element 2-32 may partially overlap the positioning element 2-42 when viewed along the first axis 2-AX1.

According to some embodiments of the present disclosure, the second driving magnetic element 2-32 may partially overlap the positioning element second elastic portion 2-425 when viewed along the first axis 2-AX1.

In this way, the internal space of the optical element driving mechanism 2-100 may be effectively utilized, and the effect of miniaturizing the optical element driving mechanism 2-100 may be achieved.

As shown in FIG. 6, the first supporting element 2-41 may at least partially overlap a movable part frame third surface 2-213 of the movable part frame 2-21 when viewed along the second axis 2-AX2.

The first supporting element 2-41 may be disposed in a movable part frame recess 2-21a of the movable part frame 2-21. The movable part frame recess 2-21a may include a movable part frame recess first surface 2-21a', and a movable part frame recess second surface 2-21a''.

The first supporting element 2-41 may be disposed between the movable part frame recess first surface 2-21a' and the movable part frame recess second surface 2-21a''.

In this way, the undesired movement of the first supporting element 2-41 may be avoided; thereby the optical element driving mechanism 2-100 is more stable.

Please refer back to FIG. 4, according to some embodiments of the present disclosure, the first driving coil 2-33 may not overlap the positioning element 2-42 when viewed along the first axis 2-AX1.

According to some embodiments of the present disclosure, the first driving magnetic element 2-31 may not overlap the positioning element second elastic portion 2-425 when viewed along the first axis 2-AX1.

Please refer to FIG. 4, according to some embodiments of the present disclosure, the first driving coil 2-33 may not overlap the positioning element first elastic portion 2-423 when viewed along the first axis 2-AX1.

According to some embodiments of the present disclosure, the first driving coil 2-33 may not overlap the positioning element second elastic portion 2-425 when viewed along the first axis 2-AX1.

In this way, magnetic interference may be effectively avoided, thereby increasing the manipulation accuracy of the optical element driving mechanism 2-100.

According to some embodiments of the present disclosure, the second driving magnetic element 2-32 may not overlap the positioning element first elastic portion 2-423 when viewed along the first axis 2-AX1.

As shown in FIG. 4, according to some embodiments of the present disclosure, the second driving coil 2-34 may not overlap the positioning element first elastic portion 2-423 when viewed along the first axis 2-AX1.

According to some embodiments of the present disclosure, the second driving coil 2-34 may not overlap the positioning element second elastic portion 2-425 when viewed along the first axis 2-AX1.

According to some embodiments of the present disclosure, the second driving coil 2-34 may not overlap the positioning element 2-42 when viewed along the first axis 2-AX1.

Please refer to FIG. 4, according to some embodiments of the present disclosure, the first driving coil 2-33 may not overlap the positioning element first elastic portion 2-423 when viewed along the third axis 2-AX3.

According to some embodiments of the present disclosure, the first driving magnetic element 2-31 may not overlap the positioning element first elastic portion 2-423 when viewed along the third axis 2-AX3.

As shown in FIG. 4, according to some embodiments of the present disclosure, the second driving coil 2-34 may not overlap the positioning element second elastic portion 2-425 when viewed along the third axis 2-AX3.

According to some embodiments of the present disclosure, the second driving magnetic element 2-32 may not overlap the positioning element second elastic portion 2-425 when viewed along the third axis 2-AX3.

In this way, magnetic interference may be effectively avoided, thereby increasing the manipulation accuracy of the optical element driving mechanism 2-100.

Figure 7:
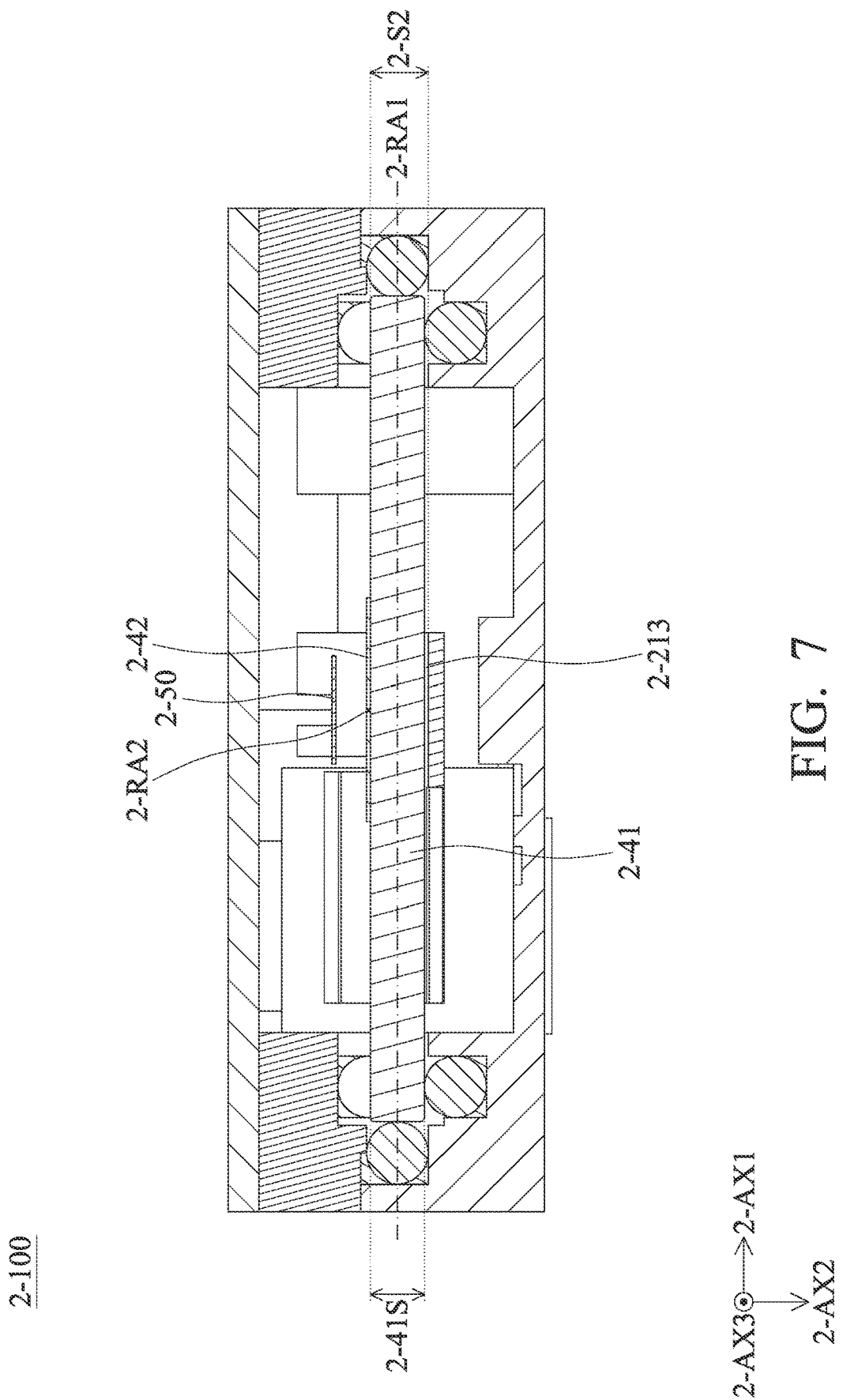
FIG. 7 is a cross-sectional view of the optical element driving mechanism along line 2-D-2-D' of FIG. 2, according to some embodiments of the present disclosure.
Figure 8:
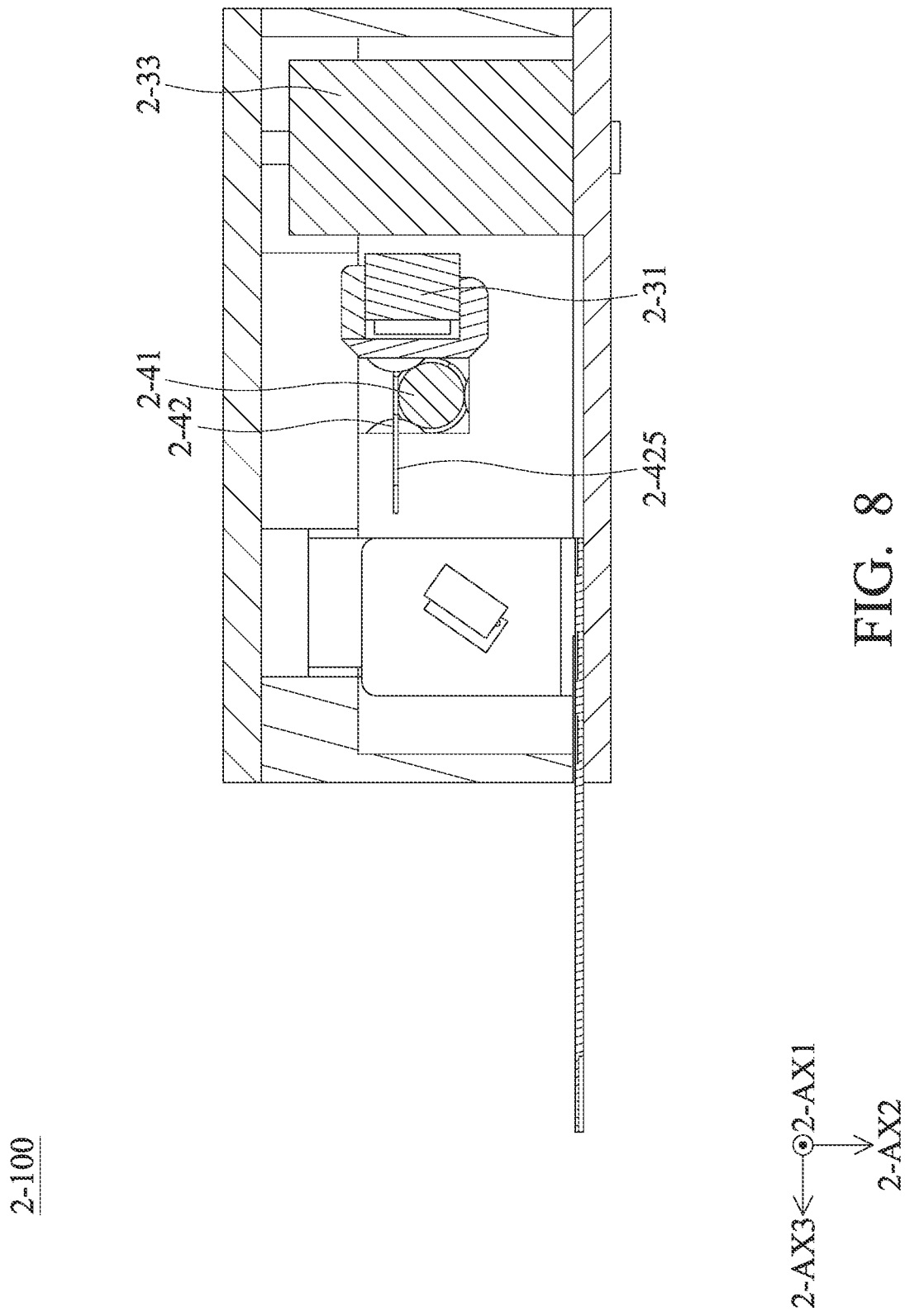
FIG. 8 is a cross-sectional view of the optical element driving mechanism along line 2-E-2-E' of FIG. 2, according to some embodiments of the present disclosure.

Please refer to FIG. 7 and FIG. 8, FIG. 7 is a cross-sectional view of the optical element driving mechanism 2-100 along line 2-D-2-D' of FIG. 2, according to some embodiments of the present disclosure; FIG. 8 is a cross-sectional view of the optical element driving mechanism 2-100 along line 2-E-2-E' of FIG. 2, according to some embodiments of the present disclosure.

As shown in FIG. 7 and FIG. 8, according to some embodiments of the present disclosure, in the third axis 2-AX3, the shortest distance 2-S1 between the movable part frame recess first surface 2-21a' and the movable part frame recess second surface 2-21a" may be 0.03 mm (millimeter) to 0.1 mm greater than the maximum dimension 2-41S of the first supporting element 2-41.

According to some embodiments of the present disclosure, in the second axis 2-AX2, the shortest distance 2-S2 between the positioning element 2-42 and the movable part frame third surface 2-213 may be 0.03 mm to 0.1 mm greater than the maximum dimension 2-41S of the first supporting element 2-41.

In this way, the movement of the first supporting element 2-41 may be facilitated, so that the optical element driving mechanism 2-100 may be operated smoothly.

Please refer to FIG. 4, FIG. 5 and FIG. 8, according to some embodiments of the present disclosure, the driving assembly 2-30 may partially overlap the positioning element 2-42 when viewed along the third axis 2-AX3.

According to some embodiments of the present disclosure, the first driving magnetic element 2-31 may partially overlap the positioning element second elastic portion 2-425 when viewed along the third axis 2-AX3.

As shown in FIG. 4, FIG. 5 and FIG. 8, according to some embodiments of the present disclosure, the first driving coil 2-33 may partially overlap the positioning element second elastic portion 2-425 when viewed along the third axis 2-AX3.

According to some embodiments of the present disclosure, the second driving magnetic element 2-32 may partially overlap the positioning element first elastic portion 2-423 when viewed along the third axis 2-AX3.

Please refer to FIG. 4, FIG. 5 and FIG. 8, according to some embodiments of the present disclosure, the second driving coil 2-34 may partially overlap the positioning element first elastic portion 2-423 when viewed along the third axis 2-AX3.

In this way, the internal space of the optical element driving mechanism 2-100 may be effectively utilized; thereby achieving the effect of miniaturizing the optical element driving mechanism 2-100.

Figure 9:
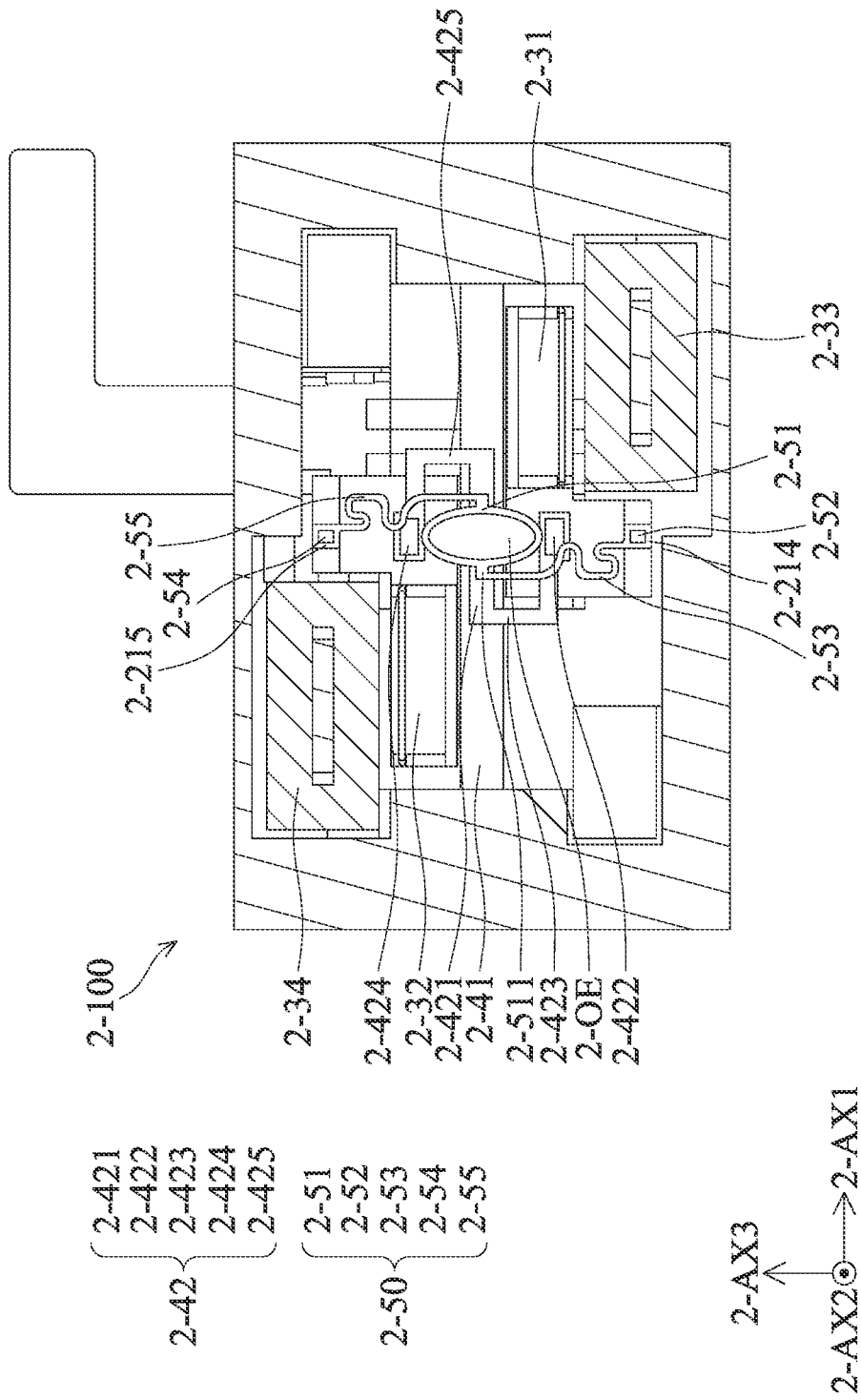
FIG. 9 is a cross-sectional view of the optical element driving mechanism along line 2-F-2-F' of FIG. 2, according to some embodiments of the present disclosure.
Figure 10:
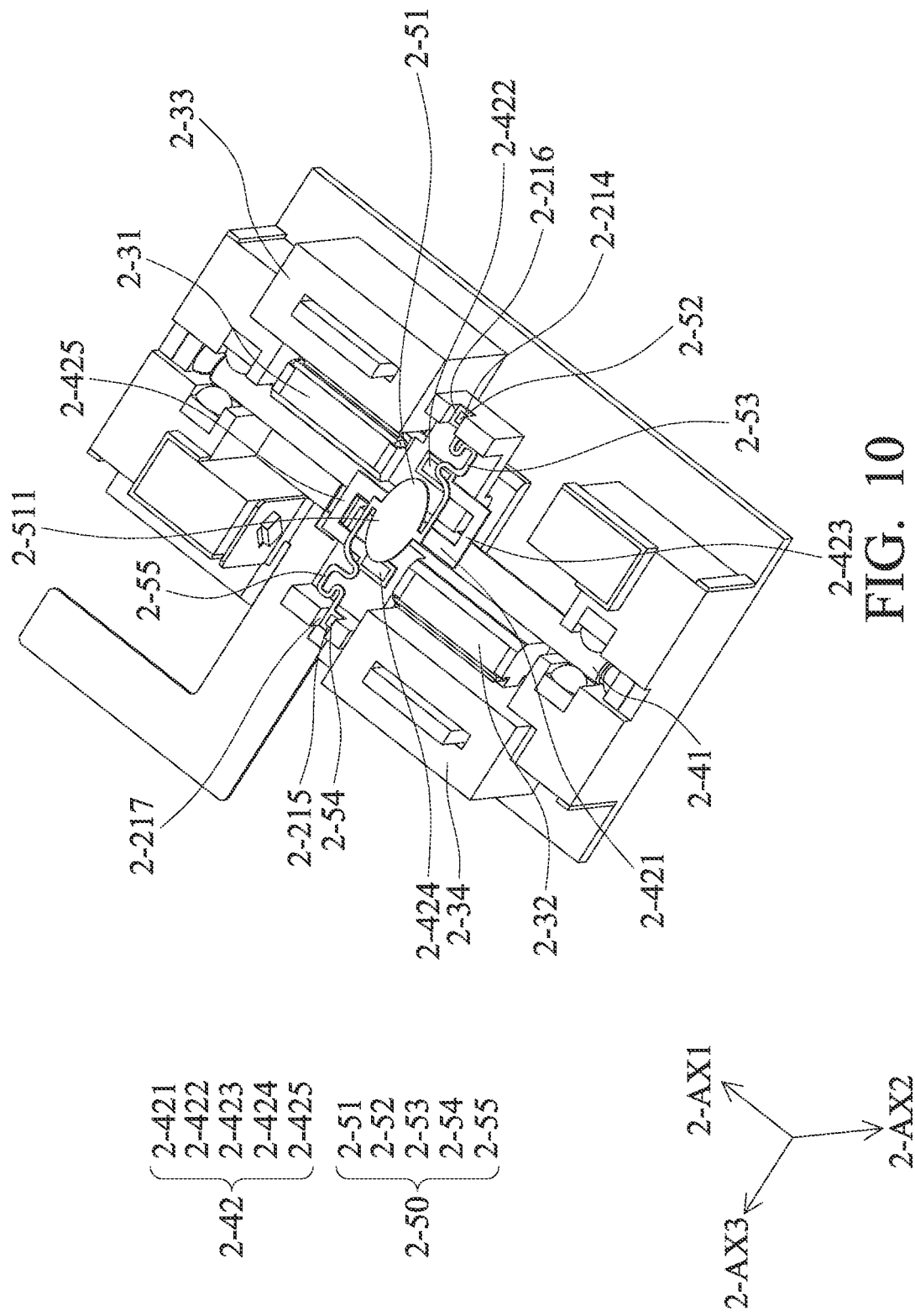
FIG. 10 is a schematic view of the optical element driving mechanism according to some embodiments of the present disclosure, wherein the outer frame is omitted.

Please refer to FIG. 9 and FIG. 10, FIG. 9 is a cross-sectional view of the optical element driving mechanism 2-100 along line 2-F-2-F' of FIG. 2, according to some embodiments of the present disclosure; FIG. 10 is a schematic view of the optical element driving mechanism 2-100 according to some embodiments of the present disclosure, wherein the outer frame 2-11 is omitted.

According to some embodiments of the present disclosure, the optical element 2-OE may move relative to the movable part frame 2-21 through the second supporting assembly 2-50.

As shown in FIG. 9 and FIG. 10, the second supporting assembly 2-50 may include a second supporting assembly setting portion 2-51, a second supporting assembly first movable part frame fixing end 2-52, a second supporting assembly first elastic portion 2-53, a second supporting assembly second movable part frame fixing end 2-54, and a second supporting assembly second elastic portion 2-55.

According to some embodiments of the present disclosure, the second supporting assembly setting portion 2-51 may be used for placing the optical element 2-OE. That is, the optical element 2-OE may be fixed to the second supporting assembly setting portion 2-51.

The second supporting assembly first movable part frame fixing end 2-52 may be fixedly connected to a movable part frame fourth surface 2-214 of the movable part frame 2-21 of the movable part 2-20.

According to some embodiments of the present disclosure, the second supporting assembly first elastic portion 2-53 may be flexible. The second supporting assembly setting portion 2-51 may be movably connected to the second supporting assembly first movable part frame fixing end 2-52 through the second supporting assembly first elastic portion 2-53.

Please refer to FIG. 9 and FIG. 10, the second supporting assembly second movable part frame fixing end 2-54 may be fixedly connected to a movable part frame fifth surface 2-215 of the movable part frame 2-21.

According to some embodiments of the present disclosure, the second supporting assembly second elastic portion 2-55 may be flexible. The second supporting assembly setting portion 2-51 may be movably connected to the second supporting assembly second movable part frame fixing end 2-54 through the second supporting assembly second elastic portion 2-55.

In this way, the movement of the second supporting assembly 2-50 may be facilitated, so that the optical element driving mechanism 2-100 may be operated smoothly.

As shown in FIG. 9 and FIG. 10, according to some embodiments of the present disclosure, the movable part frame fourth surface 2-214 may be located in a movable part frame first recessed portion 2-216 of the movable part frame 2-21, and the movable part frame first recessed portion 2-216 may have a recessed structure.

According to some embodiments of the present disclosure, the movable part frame fifth surface 2-215 may be located in a movable part frame second recessed portion 2-217 of the movable part frame 2-21, and the movable part frame second recessed portion 2-217 may have recessed structure.

In this way, the undesired movement of the second supporting assembly 2-50 may be avoided, thereby the optical element driving mechanism 2-100 is more stable.

Please refer to FIG. 9 and FIG. 10, according to some embodiments of the present disclosure, the second supporting assembly first movable part frame fixing end 2-52 and the second supporting assembly second movable part frame fixing end 2-54 may be arranged along the third axis 2-AX3 when viewed along the second axis 2-AX2.

In this way, the undesired movement of the second supporting assembly 2-50 may be avoided, thereby the optical element driving mechanism 2-100 is more stable.

According to some embodiments of the present disclosure, the positioning element first movable part frame fixing end 2-422 and the positioning element second movable part frame fixing end 2-424 may be arranged along the third axis 2-AX3 when viewed along the second axis 2-AX2.

In this way, the internal space of the optical element driving mechanism 2-100 may be effectively utilized, and the effect of miniaturizing the optical element driving mechanism 2-100 may be achieved.

According to some embodiments of the present disclosure, the second supporting assembly 2-50 may not have a mirror-symmetric structure when viewed along the second axis 2-AX2.

In this way, the undesired movement of the second supporting assembly 2-50 may be avoided, thereby the optical element driving mechanism 2-100 is more stable.

Please refer to FIG. 5, FIG. 6 and FIG. 7, according to some embodiments of the present disclosure, the positioning element 2-42 may not overlap the second supporting assembly 2-50 when viewed along the first axis 2-AX1. According to some embodiments of the present disclosure, the positioning element 2-42 may not overlap the second supporting assembly 2-50 when viewed along the third axis 2-AX3.

According to some embodiments of the present disclosure, the positioning element 2-42 may be located between the first supporting element 2-41 and the second supporting assembly 2-50 when viewed along the first axis 2-AX1. According to some embodiments of the present disclosure, the positioning element 2-42 may be located between the first supporting element 2-41 and the second supporting assembly 2-50 when viewed along the third axis 2-AX3.

As shown in FIG. 5, FIG. 6 and FIG. 7, the second supporting assembly 2-50 may not overlap the first supporting element 2-41 when viewed along the first axis 2-AX1. According to some embodiments of the present disclosure, the second supporting assembly 2-50 and the first supporting element 2-41 may not overlap when viewed along the third axis 2-AX3.

In this way, the undesired movement of the first supporting element 2-41 and the second supporting assembly 2-50 may be avoided, thereby the optical element driving mechanism 2-100 is more stable.

Please refer to FIG. 9, according to some embodiments of the present disclosure, the positioning element 2-42 may partially overlap the second supporting assembly 2-50 when viewed along the second axis 2-AX2.

According to some embodiments of the present disclosure, the positioning element first elastic portion 2-423 may partially overlap the second supporting assembly first elastic portion 2-53 when viewed along the second axis 2-AX2.

According to some embodiments of the present disclosure, the positioning element second elastic portion 2-425 may partially overlap the second supporting assembly second elastic portion 2-55 when viewed along the second axis 2-AX2.

In this way, the internal space of the optical element driving mechanism 2-100 may be effectively utilized, and the effect of miniaturizing the optical element driving mechanism 2-100 may be achieved.

As shown in FIG. 9, according to some embodiments of the present disclosure, the second supporting assembly setting portion 2-51 may overlap the first supporting element 2-41 when viewed along the second axis 2-AX2.

According to some embodiments of the present disclosure, the second supporting assembly setting portion 2-51 may overlap the positioning element positioning portion 2-421 when viewed along the second axis 2-AX2.

In this way, the internal space of the optical element driving mechanism 2-100 may be effectively utilized, and the effect of miniaturizing the optical element driving mechanism 2-100 may be achieved.

Please refer to FIG. 5, FIG. 6 and FIG. 7, according to some embodiments of the present disclosure, the second supporting assembly 2-50 may partially overlap the driving element 2-30 when viewed along the first axis 2-AX1.

According to some embodiments of the present disclosure, the second supporting assembly 2-50 may not overlap the first driving magnetic element 2-31 when viewed along the first axis 2-AX1.

According to some embodiments of the present disclosure, the second supporting assembly 2-50 may not overlap the first driving magnetic element 2-31 when viewed along the third axis 2-AX3.

According to some embodiments of the present disclosure, the second supporting assembly 2-50 may not overlap the first driving magnetic element 2-31 when viewed along any direction that is perpendicular to the second axis 2-AX2.

In this way, magnetic interference may be effectively avoided, thereby increasing the manipulation accuracy of the optical element driving mechanism 2-100.

According to some embodiments of the present disclosure, the second supporting assembly 2-50 may partially overlap the first driving coil 2-33 when viewed along the first axis 2-AX1.

In this way, the internal space of the optical element driving mechanism 2-100 may be effectively utilized, and the effect of miniaturizing the optical element driving mechanism 2-100 may be achieved.

Please refer to FIG. 9 and FIG. 10, according to some embodiments of the present disclosure, the second supporting assembly setting portion 2-51 may have an elongated structure when viewed along the second axis 2-AX2.

According to some embodiments of the present disclosure, the optical element 2-OE may have an elongated structure when viewed along the second axis 2-AX2.

According to some embodiments of the present disclosure, the second supporting assembly setting portion 2-51 may extend along the first axis 2-AX1 when viewed along the second axis 2-AX2.

According to some embodiments of the present disclosure, the second supporting assembly setting portion 2-51 may extend along the third axis 2-AX3 when viewed along the second axis 2-AX2.

According to some embodiments of the present disclosure, the second supporting assembly 2-50 may include a metal material. According to some embodiments of the present disclosure, the second supporting assembly 2-50 may include a material with low magnetic-permeability. For example, the second supporting assembly 2-50 may include metals with low magnetic-permeability such as titanium and copper.

According to some embodiments of the present disclosure, the optical element 2-OE may be a reflective structure. According to some embodiments of the present disclosure, the reflective structure of the optical element 2-OE may be used to reflect an electromagnetic wave. For example, the aforementioned electromagnetic waves may be visible light or invisible light.

According to some embodiments of the present disclosure, the second supporting assembly setting portion 2-51 may have a second supporting assembly setting portion surface 2-511 corresponding to the optical element 2-OE. According to some embodiments of the present disclosure, the reflective structure of the optical element 2-OE may be directly formed on the second supporting assembly setting portion surface 2-511.

According to some embodiments of the present disclosure, the optical element 2-OE and the second supporting assembly setting portion 2-51 may be integrated into one piece. According to some embodiments of the present disclosure, the optical element 2-OE may also be an additional mirror or a prism.

According to some embodiments of the present disclosure, the roughness of the second supporting assembly setting portion surface 2-511 may be different from the surface roughness of the second supporting assembly first elastic portion 2-53.

According to some embodiments of the present disclosure, the roughness of the second supporting assembly setting portion surface 2-511 may be lower than the surface roughness of the second supporting assembly first elastic portion 2-53.

According to some embodiments of the present disclosure, the roughness of the second supporting assembly setting portion surface 2-511 may be different from the surface roughness of the second supporting assembly first movable part frame fixing end 2-52.

According to some embodiments of the present disclosure, the roughness of the second supporting assembly setting portion surface 2-511 may be lower than the second supporting assembly first movable part frame fixing end 2-52.

In this way, it is helpful to form the optical element 2-OE on the second supporting assembly setting portion surface 2-511, thereby the combination of the optical element driving mechanism 2-100 and the optical element 2-OE is more stable.

According to some embodiments of the present disclosure, the second supporting assembly setting portion 2-51 may have a first resonance frequency relative to the movable part frame 2-21. According to some embodiments of the present disclosure, the movable part frame 2-21 may have a second resonance frequency relative to the fixed part 2-10. According to some embodiments of the present disclosure, the first resonance frequency may be different from the second resonance frequency.

Please refer to FIG. 9, according to some embodiments of the present disclosure, the positioning element positioning portion 2-421 may be fixedly connected to the first supporting element 2-41. According to some embodiments of the present disclosure, the positioning element 2-42 may have a plate-like structure.

According to some embodiments of the present disclosure, the second supporting assembly 2-50 may have a plate-like structure. According to some embodiments of the present disclosure, the positioning element 2-42 may be parallel to the second supporting assembly 2-50.

According to some embodiments of the present disclosure, the driving assembly 2-30 may be used to drive the optical element 2-OE to move relative to the movable part frame 2-21 in a second dimension 2-D2. According to some embodiments of the present disclosure, the second dimension 2-D2 may be different from the first dimension 2-D1.

According to some embodiments of the present disclosure, the second dimension 2-D2 may a rotation about a second rotation axis 2-RA2, and the second rotation axis 2-RA2 may not be parallel to the first rotation axis 2-RA1.

According to some embodiments of the present disclosure, the second rotation axis 2-RA2 may be parallel to the third axis 2-AX3.

As shown in FIG. 5, FIG. 6 and FIG. 7, according to some embodiments of the present disclosure, the second rotation axis 2-RA2 may not overlap the first rotation axis 2-RA1, and there may be a gap between the second rotation axis 2-RA2 and the first rotation axis 2-RA1.

According to some embodiments of the present disclosure, the second rotation axis 2-RA2 may not overlap the first rotation axis 2-RA1 when viewed along the first axis 2-AX1.

According to some embodiments of the present disclosure, the second rotation axis 2-RA2 may not overlap the first rotation axis 2-RA1 when viewed along the third axis 2-AX3.

According to some embodiments of the present disclosure, the second rotation axis 2-RA2 may not overlap the first rotation axis 2-RA1 when viewed along any direction that is perpendicular to the second axis 2-AX2.

In this way, the undesired movement of the first supporting element 2-41 and the second supporting assembly 2-50 may be avoided, thereby the optical element driving mechanism 2-100 is more stable.

In general, the driving assembly, the first supporting assembly, and the second supporting assembly of the optical element driving mechanism of the embodiments of the present disclosure may miniaturize the optical element driving mechanism, make the optical element driving mechanism more stable, and increase the manipulation accuracy of the optical element driving mechanism, so that the optical element driving mechanism may be operated smoothly.

Although embodiments of the present disclosure and their advantages have been described in detail, it should be understood that various changes, substitutions and alterations may be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, the scope of the present disclosure is defined by the scope of the appended claims. In addition, each scope of the claims is constructed as a separate embodiment, and various combinations of the claims and combinations of embodiments are within the scope of the present disclosure.

What is claimed is:

1. An optical element driving mechanism, comprising:
   a movable part, for connecting an optical element;
   a fixed part, wherein the movable part is movable relative to the fixed part;
   a driving assembly, for driving the movable part to move relative to the fixed part; and
   a first supporting assembly, wherein the movable part is movable relative to the fixed part through the support of the first supporting assembly,
   wherein there is a gap between the movable part and the fixed part;
   wherein the first supporting assembly comprises:
   a first supporting element, having an elongated structure and extending along a first axis; and
   a positioning element, for positioning the first supporting element;
   wherein the positioning element comprises:

a positioning element first movable part frame fixing end, fixedly connected to a movable part frame first surface of a movable part frame of the movable part;
a positioning element positioning portion, corresponding to the first supporting element;
a positioning element second movable part frame fixing end, fixedly connected to a movable part frame second surface of the movable part frame;
a positioning element first elastic portion, being flexible, wherein the positioning element positioning portion is movably connected to the positioning element first movable part frame fixing end through the positioning element first elastic portion; and
a positioning element second elastic portion, being flexible, wherein the positioning element positioning portion is movably connected to the positioning element second movable part frame fixing end through the positioning element second elastic portion.

2. The optical element driving mechanism as claimed in claim 1,
wherein the driving assembly is used for driving the movable part to move in a first dimension,
wherein the first dimension is a rotation around a first rotation axis, and the first rotation axis is parallel to the first axis,
wherein the positioning element has a plate-like structure,
wherein the positioning element is made of metal,
wherein the positioning element comprises a low magnetic-permeability material,
wherein the positioning element is in direct contact with the first supporting element.

3. The optical element driving mechanism as claimed in claim 2,
wherein the positioning element positioning portion is in direct contact with the first supporting element,
wherein there is a gap between the movable part frame first surface and the movable part frame second surface,
wherein the movable part frame first surface is perpendicular to a second axis,
wherein the movable part frame first surface is parallel to the first axis,
wherein the movable part frame first surface at least partially overlaps the positioning element when viewed along the second axis,
wherein the first supporting element at least partially overlaps a movable part frame third surface of the movable part frame when viewed along the second axis,
wherein the first supporting element is movable relative to the fixed part,
wherein the first supporting element is movable relative to the movable part,
wherein the first supporting element is disposed in a movable part frame recess of the movable part frame.

4. The optical element driving mechanism as claimed in claim 3, wherein the movable part frame recess includes a movable part frame recess first surface and a movable part frame recess second surface,
wherein the first supporting element is disposed between the movable part frame recess first surface and the movable part frame recess second surface,
wherein in a third axis, the shortest distance between the movable part frame recess first surface and the movable part frame recess second surface is 0.03 mm to 0.1 mm greater than the maximum dimension of the first supporting element,
wherein the third axis is perpendicular to the second axis,
wherein the third axis is perpendicular to the first axis,
wherein in the second axis, the shortest distance between the positioning element and the movable part frame third surface is 0.03 mm to 0.1 mm greater than the maximum dimension of the first supporting element.

5. The optical element driving mechanism as claimed in claim 4, wherein the driving assembly comprises:
a first driving magnetic element;
a second driving magnetic element;
a first driving coil, corresponding to the first driving magnetic element; and
a second driving coil, corresponding to the second driving magnetic element,
wherein the first driving magnetic element having an elongated structure extends along the first axis when viewed along the second axis,
wherein the second driving magnetic element having an elongated structure extends along the first axis when viewed along the second axis,
wherein the first driving magnetic element is fixedly disposed on the movable part frame,
wherein the second driving magnetic element is fixedly disposed on the movable part frame.

6. The optical element driving mechanism as claimed in claim 5, wherein the first driving coil is fixedly disposed on the fixed part,
wherein the second driving coil is fixedly disposed on the fixed part,
wherein the first driving coil does not overlap the second driving magnetic element when viewed along the third axis,
wherein the first driving coil does not overlap the second driving magnetic element when viewed along the first axis,
wherein the first driving coil does not overlap the second driving coil when viewed along the third axis,
wherein the first driving coil does not overlap the second driving coil when viewed along the first axis.

7. The optical element driving mechanism as claimed in claim 6, wherein the optical element driving mechanism has an elongated structure when viewed along the second axis,
wherein the optical element driving mechanism extends along the first axis when viewed along the second axis,
wherein the first driving magnetic element does not overlap the positioning element when viewed along the second axis,
wherein the first driving coil does not overlap the positioning element when viewed along the second axis,
wherein the second driving magnetic element does not overlap the positioning element when viewed along the second axis,
wherein the second driving coil does not overlap the positioning element when viewed along the second axis.

8. The optical element driving mechanism as claimed in claim 7, wherein the driving assembly does not overlap the positioning element when viewed along the second axis,
wherein the driving assembly partially overlaps the positioning element when viewed along the first axis,
wherein the first driving magnetic element partially overlaps the positioning element when viewed along the first axis,
wherein the first driving magnetic element partially overlaps the positioning element first elastic portion when viewed along the first axis.

9. The optical element driving mechanism as claimed in claim 8, wherein the first driving coil does not overlap the positioning element when viewed along the first axis,
- wherein the first driving magnetic element does not overlap the positioning element second elastic portion when viewed along the first axis,
- wherein the first driving coil does not overlap the positioning element second elastic portion when viewed along the first axis,
- wherein the second driving magnetic element partially overlaps the positioning element when viewed along the first axis.

10. The optical element driving mechanism as claimed in claim 9, wherein the second driving magnetic element does not overlap the positioning element first elastic portion when viewed along the first axis,
- wherein the second driving coil does not overlap the positioning element, when viewed along the first axis,
- wherein the second driving magnetic element partially overlaps the positioning element second elastic portion when viewed along the first axis,
- wherein the second driving coil does not overlap the positioning element second elastic portion when viewed along the first axis.

11. The optical element driving mechanism as claimed in claim 10, wherein the driving assembly partially overlaps the positioning element when viewed along the third axis,
- wherein the first driving magnetic element does not overlap the positioning element first elastic portion when viewed along the third axis,
- wherein the first driving magnetic element partially overlaps the positioning element second elastic portion when viewed along the third axis,
- wherein the first driving coil does not overlap the positioning element first elastic portion when viewed along the third axis,
- wherein the first driving coil partially overlaps the positioning element second elastic portion when viewed along the third axis,
- wherein the second driving magnetic element partially overlaps the positioning element first elastic portion when viewed along the third axis,
- wherein the second driving magnetic element does not overlap the positioning element second elastic portion when viewed along the third axis,
- wherein the second driving coil partially overlaps the positioning element first elastic portion when viewed along the third axis,
- wherein the second driving coil does not overlap the positioning element second elastic portion when viewed along the third axis.

12. The optical element driving mechanism as claimed in claim 4, further comprising a second supporting assembly, wherein the optical element is movable relative to the movable part frame through the second supporting assembly,
- wherein the second supporting assembly includes:
  - a second supporting assembly first movable part frame fixing end, fixedly connected to a movable part frame fourth surface of the movable part frame;
  - a second supporting assembly setting portion, for setting the optical element;
  - a second supporting assembly second movable part frame fixing end, fixedly connected to a movable part frame fifth surface of the movable part frame;
  - a second supporting assembly first elastic portion, being flexible, wherein the second supporting assembly setting portion is movably connected to the second supporting assembly first movable part frame fixing end through the second supporting assembly first elastic portion; and
  - a second supporting assembly second elastic portion, being flexible, wherein the second supporting assembly setting portion is movably connected to the second supporting assembly second movable part frame fixing end through the second supporting assembly second elastic portion,
- wherein the movable part frame fourth surface is located at a movable part frame first recessed portion of the movable part frame, and the movable part frame first recessed portion has a recessed structure,
- wherein the movable part frame fifth surface is located at a movable part frame second recessed portion of the movable part frame, and the movable part frame second recessed portion has a recessed structure,
- wherein the second supporting assembly first movable part frame fixing end and the second supporting assembly second movable part frame fixing end are arranged along the third axis when viewed along the second axis,
- wherein the positioning element first movable part frame fixing end and the positioning element second movable part frame fixing end are arranged along the third axis when viewed along the second axis.

13. The optical element driving mechanism as claimed in claim 12, wherein the second supporting assembly does not have a mirror symmetry structure when viewed along the second axis,
- wherein the positioning element does not overlap the second supporting assembly when viewed along the first axis,
- wherein the positioning element is located between the first supporting element and the second supporting assembly when viewed along the first axis,
- wherein the second supporting assembly does not overlap the first supporting element when viewed along the first axis,
- wherein the positioning element partially overlaps the second supporting assembly when viewed along the second axis.

14. The optical element driving mechanism as claimed in claim 13, wherein the positioning element first elastic portion partially overlaps the second supporting assembly first elastic portion when viewed along the second axis,
- wherein the positioning element second elastic portion partially overlaps the second supporting assembly second elastic portion when viewed along the second axis,
- wherein the second supporting assembly setting portion overlaps the first supporting element when viewed along the second axis,
- wherein the second supporting assembly setting portion overlaps the positioning element positioning portion when viewed along the second axis.

15. The optical element driving mechanism as claimed in claim 14, wherein the second supporting assembly partially overlaps the driving assembly when viewed along the first axis,
- wherein the second supporting assembly does not overlap the first driving magnetic element when viewed along the first axis,
- wherein the second supporting assembly does not overlap the first driving magnetic element when viewed along any direction that is perpendicular to the second axis, wherein the second supporting assembly partially overlaps the first driving coil when viewed along the first axis.

16. The optical element driving mechanism as claimed in claim 15, wherein the second supporting assembly setting portion has an elongated structure when viewed along the second axis,
   wherein the second supporting assembly setting portion extends along the first axis or the third axis when viewed along the second axis,
   wherein the second supporting assembly comprises a metal material,
   wherein the second supporting assembly comprises a low magnetic-permeability material.

17. The optical element driving mechanism as claimed in claim 16, wherein the optical element is a reflective structure,
   wherein the second supporting assembly setting portion has a second supporting assembly setting portion surface corresponding to the optical element,
   wherein the reflective structure is used to reflect an electromagnetic wave,
   wherein the optical element and the second supporting assembly setting portion have an integrated structure.

18. The optical element driving mechanism as claimed in claim 17, wherein the positioning element comprises:
   wherein the reflection structure is directly formed on the second supporting assembly setting portion surface,
   wherein the roughness of the second supporting assembly setting portion surface is different from the surface roughness of the second supporting assembly first elastic portion,
   wherein the roughness of the second supporting assembly setting portion surface is different from the surface roughness of the second supporting assembly first movable part frame fixing end,
   wherein the roughness of the second supporting assembly setting portion surface is lower than the surface roughness of the second supporting assembly first elastic portion,
   wherein the roughness of the second supporting assembly setting portion surface is lower than the surface roughness of the second supporting assembly first movable part frame fixing end.

19. The optical element driving mechanism as claimed in claim 12, wherein the second supporting assembly setting portion has a first resonance frequency relative to the movable part frame,
   wherein the movable part frame has a second resonance frequency relative to the fixed part,
   wherein the first resonant frequency is different from the second resonant frequency,
   wherein the positioning element positioning portion is fixedly connected to the first supporting element,
   wherein the positioning element has a plate-like structure,
   wherein the second supporting assembly has a plate-like structure,
   wherein the positioning element is parallel to the second supporting assembly.

20. The optical element driving mechanism as claimed in claim 4, wherein the driving assembly is used to drive the optical element to move relative to the movable part frame in a second dimension,
   wherein the second dimension is different from the first dimension,
   wherein the second dimension is a rotation about a second rotation axis, and the second rotation axis is not parallel to the first rotation axis,
   wherein the second rotation axis does not overlap the first rotation axis, and there is a gap between the second rotation axis and the first rotation axis,
   wherein the second rotation axis does not overlap the first rotation axis when viewed along the first axis,
   wherein the second rotation axis is parallel to the third axis.

* * * * *